US008692246B2

(12) United States Patent
Bhoovaraghan et al.

(10) Patent No.: US 8,692,246 B2
(45) Date of Patent: Apr. 8, 2014

(54) LEAKAGE MEASUREMENT STRUCTURE HAVING THROUGH SILICON VIAS

(75) Inventors: Bhavana Bhoovaraghan, Fishkill, NY (US); Mukta G. Farooq, Hopewell Junction, NY (US); Emily R. Kinser, Poughkeepsie, NY (US); Sudesh Saroop, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 13/233,085

(22) Filed: Sep. 15, 2011

(65) Prior Publication Data

US 2013/0069062 A1   Mar. 21, 2013

(51) Int. Cl.
  *H01L 23/58* (2006.01)
  *H01L 29/10* (2006.01)
  *G01R 31/26* (2006.01)
  *H01L 21/66* (2006.01)

(52) U.S. Cl.
  USPC .............. 257/48; 257/E21.531; 257/E23.002; 438/18

(58) Field of Classification Search
  None
  See application file for complete search history.

(56) References Cited

U.S. PATENT DOCUMENTS

| 5,243,498 | A | 9/1993 | Scofield |
| 7,541,203 | B1 | 6/2009 | Knickerbocker |
| 7,833,895 | B2 | 11/2010 | Bonifield et al. |
| 2010/0013512 | A1 | 1/2010 | Hargan et al. |
| 2010/0060310 | A1 | 3/2010 | Laisne |
| 2010/0164671 | A1 | 7/2010 | Pagani |
| 2010/0332177 | A1 | 12/2010 | Wu et al. |
| 2011/0080184 | A1 | 4/2011 | Wu et al. |
| 2011/0102006 | A1 | 5/2011 | Choi et al. |
| 2011/0102011 | A1 | 5/2011 | Van Der Plas et al. |

FOREIGN PATENT DOCUMENTS

| JP | 2000068345 | 3/2000 |
| KR | 20090079513 | 7/2009 |
| WO | WO 2011101393 | 8/2011 |

OTHER PUBLICATIONS

International Search Report/Written Opinion; Feb. 28, 2013, application # PCT US2012/055276.
Menglin, Tsai et al., Conference Paper, "Through silicon via (TSV) defect/pinhole self test circuit for 3D-IC", presented at the 2009 IEEE International Conference on 3D System Integration (3DIC) on Sep. 28-30, 2009 at San Francisco, CA, USA.

*Primary Examiner* — Michael Jung
(74) *Attorney, Agent, or Firm* — Katherine S. Brown; Ian D. MacKinnon

(57) ABSTRACT

A leakage measurement structure for through substrate vias which includes a semiconductor substrate; a plurality of through substrate vias in the semiconductor substrate extending substantially through the semiconductor substrate; and a leakage measurement structure located in the semiconductor substrate. The leakage measurement structure includes a plurality of substrate contacts extending into the semiconductor substrate; a plurality of sensing circuits connected to the plurality of through substrate vias and to the plurality of the substrate contacts, the plurality of sensing circuits providing a plurality of outputs indicative of current leakage from the plurality of through substrate vias; a built-in self test (BIST) engine to step through testing of the plurality of through substrate vias; and a memory coupled to the BIST engine to receive the outputs from the plurality of sensing circuits. Also included is a method of testing a semiconductor substrate.

21 Claims, 4 Drawing Sheets

LEAKAGE MEASUREMENT STRUCTURE HAVING THROUGH SILICON VIAS

BACKGROUND

The present invention relates to the testing of through silicon vias in semiconductor structures and, more particularly, to the testing of through silicon vias by an apparatus that may test each through silicon via before the semiconductor structure is complete.

Three-dimensional (3D) stacking of semiconductor chips promises higher transistor densities and smaller footprints of electronic products. 3D stacking is a single package containing a vertical stack of semiconductor chips which are interconnected by means of through silicon vias (TSVs). 3D stacking based on TSVs offers the benefits of more functionality, higher bandwidth and performance at smaller sizes, alongside lower power consumption and cost, even in an era in which conventional feature-size scaling becomes increasingly difficult and expensive. TSVs provide an electrical connection from the active front-side (face) of a semiconductor chip through the semiconductor substrate to the back-side of the substrate. TSVs allow a semiconductor chip or wafer to be vertically interconnected to another semiconductor chip or wafer. TSVs also allow the interconnection of multiple vertically stacked semiconductor chips or wafers with each other.

3D stacks of semiconductor chips interconnected by TSVs need to be tested for manufacturing defects, in order to guarantee sufficient outgoing product quality to a customer. Current leakage associated with TSVs is a significant reliability concern in semiconductor structures containing TSVs. In the present state of the art, additional processing must be completed to enable direct probing of structures directly contacting the TSVs (or TSV capture pads corresponding to the TSVs) to test for current leakage. The TSVs and surrounding protection may actually be damaged by direct probing. To prevent damage to the TSVs, leakage measurements may only be done in the kerf structures, not on the actual product, which limits the number of TSVs to be tested to a small sample of the total number of TSVs present in a chip. Additionally, only a single threshold for detection of leakage may exist meaning only a binary classification of leakage is used. Such a binary classification of current leakage may not be adequate for accurately assessing any shift in TSV leakage current with respect to time.

BRIEF SUMMARY

The various advantages and purposes of the exemplary embodiments as described above and hereafter are achieved by providing, according to a first aspect of the exemplary embodiments, a leakage current measurement structure for through silicon vias including a silicon on insulator (SOI) substrate comprising a semiconductor base, an insulating layer and a silicon layer on the insulator (SOI) layer; a plurality of through silicon vias extending into the SOI substrate, such that each through silicon via has its own corresponding substrate contact and sensing circuit to which it is connected; and a leakage measurement structure located in the SOI layer. The leakage measurement structure includes a substrate contact for each through silicon via extending between the SOI layer and the semiconductor base; a sensing circuit for each through silicon via connected to each of the through silicon vias and to each of the substrate contacts and providing an output indicative of current leakage from each of the through silicon vias; a built-in self test (BIST) engine to step through testing of the through silicon vias; and a memory element coupled to the BIST engine to receive the output from each of the sensing circuits.

According to a second aspect of the exemplary embodiments, there is provided a leakage measurement structure for through vias including a semiconductor substrate having an active layer; a plurality of through substrate vias in the semiconductor substrate extending substantially through the semiconductor substrate; and a leakage measurement structure located on and in the semiconductor substrate. The leakage measurement structure includes a plurality of substrate contacts extending into the semiconductor substrate; a plurality of sensing circuits connected to the plurality of through substrate vias and to the plurality of the substrate contacts, the plurality of sensing circuits providing a plurality of outputs indicative of current leakage from the plurality of through vias; a built-in self test (BIST) engine to step through testing of the plurality of through vias; and a memory element coupled to the BIST engine to receive the outputs from the plurality of sensing circuits.

According to a third aspect of the exemplary embodiments, there is provided a method of testing a semiconductor substrate having an active layer and a plurality of through substrate vias for current leakage including forming a leakage measurement structure located on and in the semiconductor substrate active layer which includes a plurality of substrate contacts extending into the semiconductor substrate; a plurality of sensing circuits connected to the plurality of through substrate vias and to the plurality of the substrate contacts, such that there is a one-to-one correspondence of a substrate contact and sensing circuit to each through substrate via; a built-in self test (BIST) engine to step through testing of the plurality of through substrate vias; and a memory element coupled to the BIST. The method further includes applying a reference current to the sensing circuits to set a current leakage threshold for the plurality of through substrate vias; selecting a through substrate via for testing by the BIST engine; sensing by the sensing circuit the selected through substrate via to determine whether there is current leakage from the selected through substrate via; and providing by the sensing circuit an output to the memory indicative of current leakage from the selected through substrate via such that if the sensed current leakage for the selected through via exceeds the leakage threshold, the sensing circuit for the selected through substrate via providing the output indicative of current leakage from the selected through substrate via.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

Figure 1:
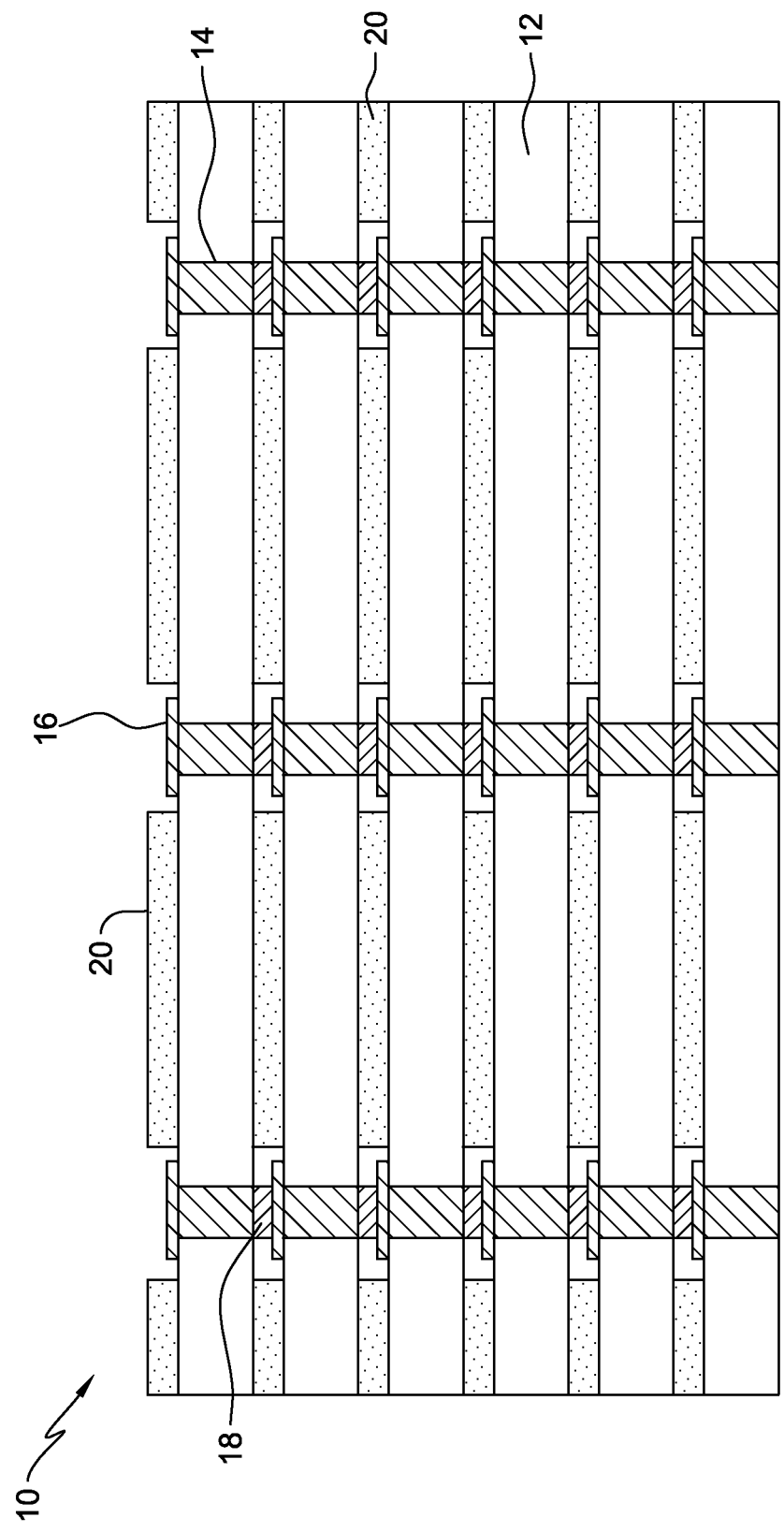
FIG. 1 is a partial cross-sectional view of a conventional three-dimensional (3D) stack of semiconductor wafers.

Referring to the Figures in more detail, and particularly referring to FIG. 1, there is shown, for purposes of illustration and not limitation, an implementation of a 3D stack 10 of semiconductor wafers 12 containing a plurality of TSVs 14. Each semiconductor wafer 12 may have a bonding pad 16 for connecting one TSV 14 to another TSV 14. The TSVs 14 are usually filled with a metal such as copper. There may be a joining material 18, such as copper or solder, to electrically connect the TSV 14 to the bonding pad 16 on either end of the TSV 14. Each semiconductor wafer 12 may be joined to another semiconductor wafer 12 by a bonding layer 20, which may consist of adhesive or some other means not limited by the scope of this invention. After the 3D stack 10 has been formed, it may be diced into individual 3D stacks of semiconductor chips, each of which may contain a plurality of TSVs 14.

Although the prior art example represented in FIG. 1 illustrates a multiplicity of wafers joined together, a 3D stack may also comprise a multiplicity of semiconductor dies joined together. Wafer to wafer, or die to die, or die to wafer joining may be accomplished by various means known to those skilled in the art.

As previously noted, current leakage associated with TSVs is a significant reliability concern in semiconductor structures containing TSVs. It would be desirable to be able to test the TSVs while in the wafer stage, prior to joining wafers or die into a 3D stack 10.

In present day testing, electrical testing of TSVs is completed by physically probing individual TSVs or probe pads connected to them. Physical direct probing of TSVs is undesirable as it may result in damage to the TSVs. Additionally, only a limited number of TSVs are able to be tested due time constraints associated with physically probing individual TSVs, and these tested TSVs may be in the kerf areas and not the product areas of the wafer. It would be desirable to test each and every TSV in the product areas of the wafer and in a way that would be nondestructive with respect to the TSV as well as not significantly affect the normal operation of the TSV in the product.

Figure 2:
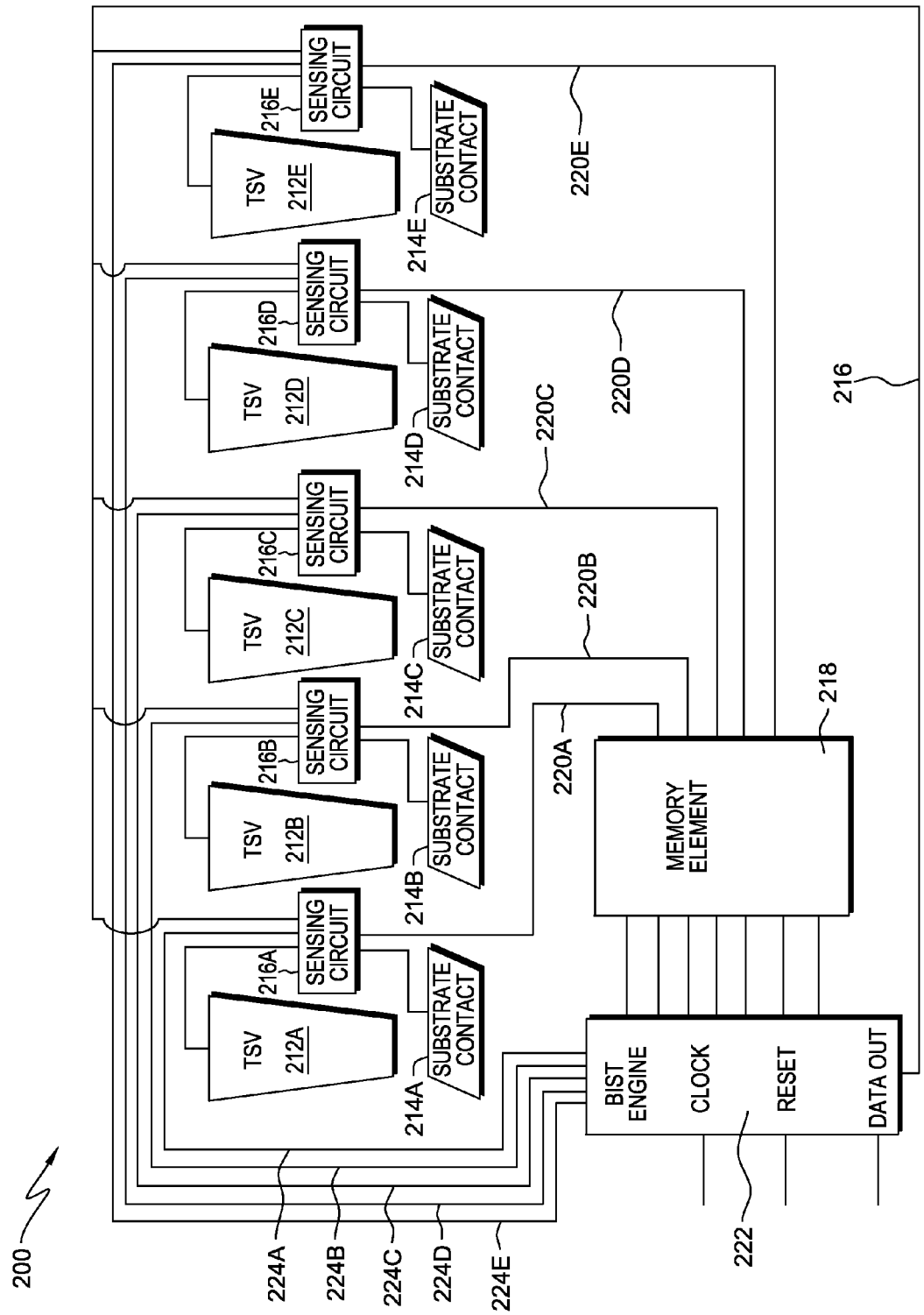
FIG. 2 is a schematic of a semiconductor test structure according to the exemplary embodiments.

Referring now to FIG. 2, there is illustrated a schematic of a semiconductor test structure 200 located in a semiconductor on insulator (SOI) wafer (not shown). The SOI wafer may be any of the wafers 12 shown in FIG. 1. In addition, the semiconductor test structure 200 may be located in a bulk semiconductor instead of an SOI wafer, although locating the test structure 200 in an SOI wafer is a preferred embodiment.

It should be understood that a semiconductor wafer typically includes a plurality of semiconductor chips, and each of the semiconductor chips includes a plurality of TSVs 212A, 212B, 212C, 212D, 212E. While only five representative TSVs are shown in FIG. 2, it is understood that there will be many more such TSVs in a typical semiconductor chip. Each of the TSVs 212 A-E is connected to a sensing circuit 216 A-E where each sense circuit corresponds to an individual TSV. That is, TSV 212A is connected to sensing circuit 216A, TSV 212B is connected to sensing circuit 216B and so on.

The details of sensing circuit 216A-E will be discussed hereafter.

The test structure 200 further includes substrate contacts 214A-E connected to sensing circuits 216 A-E. The substrate contacts 214 A-E monitor whether the TSVs 212 A-E are in electrical contact with the semiconductor wafer base substrate. The TSVs 212 A-E should be electrically isolated from the semiconductor wafer.

In a preferred exemplary embodiment, each TSV 212 A-E has its own sensing circuit 216 A-E and substrate contact 214 A-E. That is, TSV 212A is connected to sensing circuit 216A while sensing circuit 216A is connected to substrate contact 214A. This one-to-one relationship continues for all of the remaining TSVs 212 B-E, sensing circuits 216 B-E and substrate contacts 214 A-E.

An output 220A-E of sensing circuit 216A-E is received by memory element 218 and recorded by location of the TSV 212A-E. Memory element 218 is coupled to BIST engine 222.

BIST engine 222 through TSV select lines 224A-E may select any one of the TSVs 212A-E or all of the TSVs 212A-E for testing of leakage. BIST engine 222 may select TSVs 212A-E sequentially or in any order or even all at the same time. In a preferred embodiment, all of the TSVs 212A-E on the semiconductor wafer may be selected and tested. BIST engine 222 may apply a reference current 226 to each of the sensing circuits 216A-E.

The substrate contact 214A-E and sensing circuit 216A-E are shown being located adjacent to each TSV 212A-E. For example, in a preferred embodiment, substrate contact 214A and sensing circuit 216A are shown as being located adjacent to TSV 212A, substrate contact 214B and sensing circuit 216B are shown as being located adjacent to TSV 212B and so on. However, the substrate contact 214A-E and sensing circuit 216A-E, along with the memory element 218 and BIST engine 222 may be located at any location on the semiconductor chip, but it is preferred that they be located in the product area and not in the kerf area.

Figure 3:
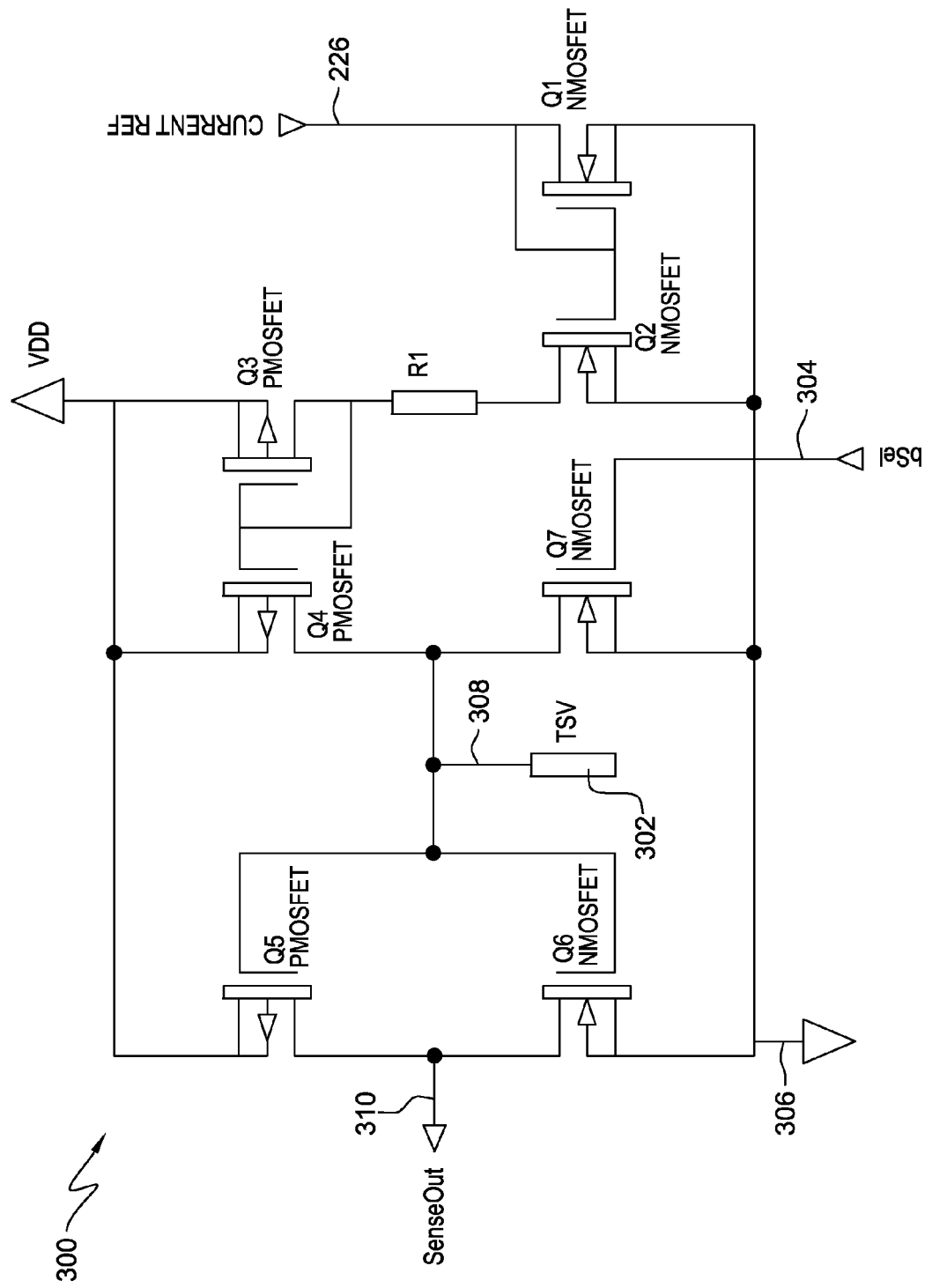
FIG. 3 is a schematic of a sensing circuit according to the exemplary embodiments.

Referring now to FIG. 3, an exemplary embodiment of a sensing circuit 300 is illustrated. Sensing circuit 300 may be any of the sensing circuits 216 A-E shown in FIG. 2. In the following discussion, an N-type metal oxide field effect transistor may be referred to as an NMOSFET or simply NFET, while a P-type metal oxide field effect transistor may be referred to as a PMOSFET or simply PFET. The reference current 226 is applied to the sensing circuit 300 and is routed through transistor Q1, (which may be an NFET), transistor Q2 (which may be an NFET), resistor R1, transistor Q3 (which may be a PFET) and then to transistor Q4 (which may be a PFET). The reference current 226 is selected such that transistor Q4 floats high and is set at 1.

A TSV 302 is connected 308 to sensing circuit 300, more specifically is connected to a source/drain of transistor Q4. The sensing circuit 300 may also be connected to a substrate ground 306, which actually corresponds to the substrate contacts 214A-E in FIG. 2. More specifically, substrate ground 306 is connected to a source/drain of transistor Q6. Sensing circuit 300 further includes transistors Q5 (which may be a PFET) and Q6 (which may be an NFET). Transistors Q5 and Q6 together form an inverter to invert the result from transistor Q4 and provide a SenseOut result 310. The SenseOut result 310 is the output 220A-E provided to memory element 218 (shown in FIG. 2). When the BIST engine 222 (FIG. 2) selects through bSel signal 304 a TSV 302 for testing, transistor Q7 (which may be an NFET) is turned off. The bSel signal 304 may be any of the TSV select lines 224A-E shown in FIG. 2. If there is current leakage less than a threshold set by the current reference 226, transistor Q4 stays high at "1" and inverter transistors Q5, Q6 output a "0" as the SenseOut result 310. If there is current leakage that exceeds the threshold set by the current reference 226, transistor Q4 is pulled low and goes to "0" and inverter transistors Q5, Q6 output a "1" as the SenseOut result 310. The current reference 226 may be adjusted to vary the current leakage threshold as required by the design of the semiconductor chip.

Current leakage may occur either through contact with the bulk semiconductor substrate or through adjacent TSVs. Contact through substrate contact 306 will indicate current leakage to the bulk semiconductor substrate. Normally, a TSV is formed in a trench or via opening wherein a dielectric is first deposited so that the TSV is isolated from the bulk semiconductor substrate. In a normal functioning TSV, there should be no leakage to the bulk semiconductor substrate during testing. After backside grind of the semiconductor substrate in preparation for joining to another semiconductor wafer or chip, the dielectric at the bottom of the TSV is removed and the TSV is exposed for joining to the other semiconductor wafer or chip. There may be current flow when the TSV is joined to the other wafer or semiconductor device but not before in a normal functioning TSV.

If there is current leakage to an adjacent TSV, this current leakage may be detected as follows. Only the transistor Q7 of the selected TSV 302 is turned off; the transistors Q7 of adjacent TSVs are on. So, if there is current leakage with an adjacent TSV, the current path will be from TSV 302 to an adjacent TSV and then transistor Q7 in the sensing circuit for the adjacent TSV and then to ground. Transistor Q4 in sensing circuit 300 will sense the current leakage to the adjacent TSV, be pulled low to "0" and inverter transistors Q5, Q6 will output a "1" as the SenseOut result 310.

The SenseOut result 310 may be representative of any type of current leakage. That is, the SenseOut result 310 may simply indicate that there is current leakage somewhere but not specifically indicate whether the current leakage is coming from leakage to the semiconductor substrate or leakage from an adjacent TSV. Alternatively, the BIST engine may be cycled to indicate the precise origin of the current leakage.

Figure 4:
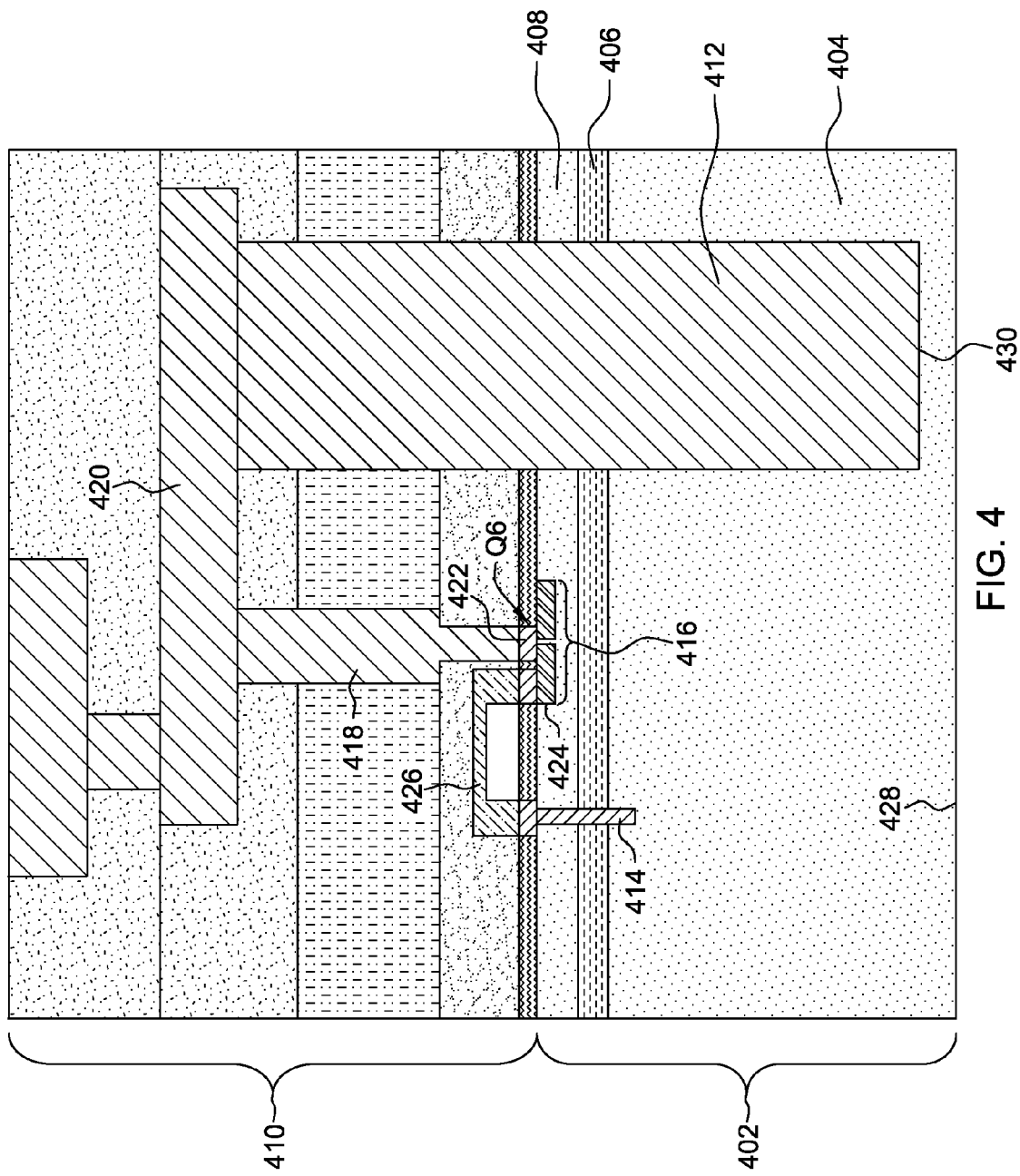
FIG. 4 is a cross-sectional view of an SOI wafer having the semiconductor test structure according to the exemplary embodiments.

Referring now to FIG. 4, there is shown a cross sectional view of a wafer, such as an SOI wafer 402 having a TSV 412 and a semiconductor test structure. SOI wafer 402 includes a semiconductor substrate 404, a BOX layer 406 (also known as a buried oxide layer) and an SOI layer 408. On top of SOI wafer 402 are a plurality of BEOL (back end of the line) wiring layers 410. Shown also is the TSV 412 extending from the BEOL wiring layers 410 well into the semiconductor substrate 404. The TSV 412 may extend substantially through the semiconductor substrate 404. In use, the thickness of the semiconductor substrate 404 may be thinned from the backside 428 of the SOI wafer 402 by conventional means such as a back grind process to expose an end 430 of the TSV 412.

It should be understood that the semiconductor substrate 404 may comprise any semiconductor material in use today or in the future. Similarly, SOI layer 408 may comprise any semiconductor material in use today or in the future. Typically, the semiconductor material comprising the semiconductor substrate 404 and SOI layer 408 may include silicon.

It should also be understood that while a TSV is usually referred to as a "through silicon" via because it may extend through a substrate comprising silicon, the TSV in fact may extend through semiconductor materials that do not include silicon. Even in this latter case, a TSV may still be referred to as a "through silicon via". Alternatively, it may be referred to as a "through substrate via" or more simply a "through via".

Located within SOI wafer 402 is a substrate contact 414 which extends from the SOI layer 408 into the semiconductor substrate 404. Substrate contact 414 corresponds to substrate contact 306 in FIG. 3 and substrate contact 214A-E in FIG. 2. Also located within SOI layer 408 is a sensing circuit, generally shown as 416, which is represented as 216A-E in FIG. 2 and described in detail in FIG. 3. Specifically shown within sensing circuit 416 is preferably transistor Q6 (from FIG. 3). The gate 422 of transistor Q6 may be connected by via 418 and wiring line 420 in the BEOL layer 410 to TSV 412. A source/drain 424 of transistor Q6 may be connected by wiring 426 to substrate contact 414. Not shown is another TSV situated to the left of the substrate contact 414.

For purposes of illustration and not limitation, the TSV 412 may have a diameter of about 25 μm (microns), the sensing circuit 416 may have an area dimension of about 1 μm² and the substrate contact 414 may have a diameter of about 40 nm (nanometers).

The exemplary embodiments further include a method for testing a semiconductor having an active layer and a plurality of through vias. A leakage measurement structure as previously described is formed in the semiconductor substrate active layer. A reference current is applied to the sensing circuits to set a current leakage threshold for the plurality of through vias. A through via is selected for testing by the BIST engine. The sensing circuit senses the selected through via to determine whether there is current leakage from the selected through via. Preferably, sensing by the sensing circuit includes testing by the substrate contact for the selected through via for current leakage of the selected through via to the semiconductor substrate, as well as testing for current leakage of the selected through via to another through via. The sensing circuit provides an output to the memory indicative of current leakage from the selected through via such that if the sensed current leakage for the selected through via exceeds the leakage threshold, the sensing circuit for the selected through via provides the output indicative of current leakage from the selected through via. The output may be stored in the memory element.

In the method, the steps of selecting, sensing and storing outputs are repeated until a predetermined number of through vias have been tested for current leakage. Preferably, all of the plurality of TSVs will be tested. Preferably, the reference current may be varied to change the current leakage threshold.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A leakage measurement structure for through silicon vias comprising:
a silicon on insulator (SOI) substrate comprising a semiconductor base, an insulating layer and a silicon on insulator (SOI) layer;
a plurality of through silicon vias in the SOI substrate; and
a leakage measurement structure located in the SOI layer comprising:
a substrate contact for each through silicon via extending between the SOI layer and the semiconductor base;
a sensing circuit for each through silicon via to provide an output indicative of current leakage from each of the through silicon vias, the sensing circuit for each through silicon via directly connected to the substrate contact for each through silicon via and directly connected to each through silicon via such that each through silicon via has its own corresponding substrate contact and sensing circuit to which it is connected;

a built-in self test (BIST) engine connected to the sensing circuit for each through silicon via to step through testing of the plurality of through silicon vias; and
a memory element coupled to the BIST engine to receive the output from each of the sensing circuits.

2. The structure of claim 1 wherein the sensing circuit for each through silicon via can sense current leakage from the each through silicon via to the corresponding substrate contact to provide the output indicative of leakage of the each through silicon via to the SOI substrate.

3. The structure of claim 1 wherein the sensing circuit for each through silicon via can sense current leakage from the each through silicon via to an adjacent through silicon via to provide the output indicative of leakage of each of the through silicon vias to another through silicon via.

4. The structure of claim 3 further comprising the BIST engine to provide a reference current into the sensing circuit to set a leakage threshold such that if a detected leakage for one of the plurality of through silicon vias exceeds the leakage threshold, the sensing circuit provides the output that there is current leakage from the one through silicon via being tested.

5. The structure of claim 1 wherein the sensinq circuit output is provided for each through silicon via serially.

6. The structure of claim 1 wherein only one end of each of the through silicon via is connected to the leakage measurement structure through the sensing circuit.

7. The structure of claim 1 wherein each of the substrate contacts and sensing circuits is located adjacent to each through silicon via.

8. The structure of claim 1 wherein the SOI substrate further includes back end of the line wiring layers and the plurality of through silicon vias extend into the back end of the line wiring layers.

9. The structure of claim 1 wherein the sensing circuit is located in the SOI layer.

10. The structure of claim 1 wherein the BIST engine can select the through silicon via to be tested by the leakage measurement structure.

11. The structure of claim 10 wherein the BIST engine can build a location map of each through silicon via in the memory and can serially read out the contents of the memory.

12. A leakage measurement structure for through vias comprising:
a semiconductor substrate having an active layer;
a plurality of through substrate vias in the semiconductor substrate extending substantially through the semiconductor substrate; and
a leakage measurement structure located in the semiconductor substrate active layer comprising:
a plurality of substrate contacts extending into the semiconductor substrate;
a plurality of sensing circuits for the plurality of through substrate vias to provide a plurality of outputs indicative of current leakage from the plurality of through substrate vias, each of the plurality of sensing circuits directly connected to each of the plurality of substrate contacts and each of the plurality of sensing circuits directly connected to each through substrate via such that each through substrate via has its own corresponding substrate contact and sensing circuit to which it is connected;
a built-in self test (BIST) engine connected to each of the plurality of sensing circuits to step through testing of the plurality of through substrate vias; and
a memory coupled to the BIST engine to receive the outputs from the plurality of sensing circuits.

13. The structure of claim 12 wherein the sensing circuit for each through substrate via can sense current leakage from the each through substrate via to the corresponding substrate contact to provide the output indicative of leakage of the each of the through substrate via to the semiconductor substrate.

14. The structure of claim 12 wherein the sensing circuit for each through substrate via can sense current leakage from the each through substrate via to an adjacent through substrate via to provide the output indicative of leakage of each of the through substrate vias to another through substrate via.

15. The structure of claim 14 further comprising the BIST engine to provide a reference current into the plurality of sensing circuits to set a leakage threshold such that if a detected leakage for one of the plurality of through substrate vias exceeds the leakage threshold, the sensing circuit for the one through substrate via provides the output that there is current leakage from the one through substrate via.

16. The structure of claim 12 wherein the sensing circuit output is provided for each through substrate via serially.

17. The structure of claim 12 wherein only one end of the plurality of through substrate vias is connected to the leakage measurement structure through the sensing circuits.

18. The structure of claim 12 wherein a substrate contact and a sensing circuit is located adjacent to each through substrate via.

19. The structure of claim 12 wherein the semiconductor substrate further includes back end of the line wiring layers and the plurality of through substrate vias extend into the back end of the line wiring layers.

20. The structure of claim 12 wherein the BIST engine can select the through substrate via to be tested by the leakage measurement structure.

21. The structure of claim 12 wherein the BIST engine can build a location map of each through substrate via in the memory and can serially read out the contents of the memory.

* * * * *